United States Patent [19]

Leypold et al.

[11] 4,138,679
[45] Feb. 6, 1979

[54] CIRCUIT FOR SYNCHRONIZING THE OSCILLATION OF A PULSED OSCILLATOR WITH A REFERENCE OSCILLATION

[75] Inventors: Dieter Leypold; Peter Schucht, both of Munich, Fed. Rep. of Germany

[73] Assignee: Siemens Aktiengesellschaft, Berlin & Munich, Fed. Rep. of Germany

[21] Appl. No.: 703,374

[22] Filed: Jul. 8, 1976

[30] Foreign Application Priority Data

Jul. 17, 1975 [DE] Fed. Rep. of Germany ....... 2532004

[51] Int. Cl.² .......................... H01Q 3/26; H03B 3/04
[52] U.S. Cl. .................................. 343/100 SA; 331/8; 331/17; 331/18; 331/25; 331/166; 331/172
[58] Field of Search ................. 331/8, 17, 18, 25, 166, 331/172; 343/100 SA

[56] References Cited

U.S. PATENT DOCUMENTS

| 3,251,062 | 5/1966 | Ghose | 343/100 SA |
|---|---|---|---|
| 3,441,870 | 4/1969 | Wicker | 331/17 |
| 3,546,695 | 12/1970 | Freedman | 343/6.8 R |
| 3,832,713 | 8/1974 | Rubin | 331/17 |
| 3,849,736 | 11/1974 | Enerson et al. | 331/25 |

*Primary Examiner*—S. C. Buczinski
*Attorney, Agent, or Firm*—Hill, Gross, Simpson, Van Santen, Steadman, Chiara & Simpson

[57] ABSTRACT

A circuit is provided for synchronizing the oscillation $U_o$ of a pulsed oscillator with a reference oscillation $U_m$ of comparatively small amplitude. The reference oscillation is coupled into the oscillator and a phase control loop is provided in which a phase discriminator compares the phase relationship of both oscillations and provides a resulting control voltage for controlling an adjustable reactance for the frequency change of the pulsed oscillator during the leading edge of the pulse. A phase shifter, adjustable up to 180°, is connected between the oscillator and the phase discriminator. The output of the phase discriminator, which is highly resistive, is connected in a low-resistance manner to the adjustable reactance by way of an impedance converter, such as an emitter follower or a multi-stage wide-band amplifier.

7 Claims, 3 Drawing Figures

CIRCUIT FOR SYNCHRONIZING THE OSCILLATION OF A PULSED OSCILLATOR WITH A REFERENCE OSCILLATION

BACKGROUND OF THE INVENTION

1. Field of the Invention

This invention relates to a circuit for synchronizing the oscillation of a pulsed oscillator with a reference oscillation of comparatively low amplitude.

2. Description of the Prior Art

In radar systems, particularly in secondary radar systems, in which pulsed oscillators are employed, there are certain requirements for a constant frequency, which requirements can be satisfied only partially be crystal control. The expense for multiplying the crystal oscillation and amplification of the same to the required transmitting power is too great, particularly for small devices. On the other hand, a free running oscillator which can deliver the required transmitting power is, indeed, very simply constructed, but the same is not sufficiently constant in frequency. If crystal-control of a low power transmitting frequency is already present in a local oscillator, such as in the case of secondary radar systems, for example, then there is the possibility of synchronizing the pulsed oscillator to this oscillation with little expense, whereby, however, the oscillator frequency must already be captured when the oscillator begins to oscillate.

The fixed frequency synchronization of an oscillator with a reference oscillation by means of a phase discriminator and a controlled reactance, for example capacitance diodes, is known in the art. However, special circuits are required which sweep the oscillator frequency for the purpose of capturing that frequency, whereby the frequency is fixed upon sweeping the nominal frequency. However, sweeping lasts for a comparatively long period and is therefore unusable in the pulsed oscillator. If both frequencies are very similar, capturing will occur by itself. However, this cannot be assumed.

SUMMARY OF THE INVENTION

The object of the present invention is to provide a synchronization circuit for a pulsed high frequency oscillator.

Another object of the invention is to provide the synchronization circuit for a pulsed high frequency oscillator for extremely short pulses such as less than one microsecond.

A more specific object of the invention is to provide a synchronization circuit for a pulsed high frequency oscillator which is fixed in frequency over the entire length of the respective pulses.

In achieving the above objects, one must proceed from the fact that only a reference oscillation of small amplitude is available for pulling the oscillator into tune. As is known in the art, an oscillator can readily be pulled by feeding in an oscillation of the desired frequency, if only the amplitude of the pulling oscillation is sufficiently large in relation to the oscillation of the oscillator. In accordance with the invention, this problem is solved in that the reference oscillation is coupled into the oscillator, in and a phase control loop is provided having a phase discriminator which compares the phase relationship of both oscillations and provides a resulting control voltage already during the leading edge of the pulse for controlling an adjustable reactance to change the frequency of the pulsed oscillator. A phase shifter, adjustable up to 180°, is connected between the oscillator and the phase discriminator, and the output of the phase discriminator, which has been designed highly resistive, is connected in a low resistance fashion to the adjustable reactance by way of an impedance converter, for example an emitter follower or a multi-stage wideband amplifier. Therefore, the invention exploits the fact that the injection of an oscillation of small amplitude into an oscillator permits oscillation in the oscillator when it is keyed with this frequency. The dimensioning of the control circuit containing the phase shifter is designed such that the control voltage occurring between the beginning of oscillation functions sufficiently fast to maintain the oscillation of the rising pulse synchronized.

Under certain circumstances, it is possible to omit a phase shifter constructed as a special component, particularly in those instances in which the phase discriminator is non-symmetrically tuned, i.e. when the phase discriminator already delivers a small pulse direct voltage having the oscillation of the oscillator alone, without a comparison oscillation.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

Figure 1:
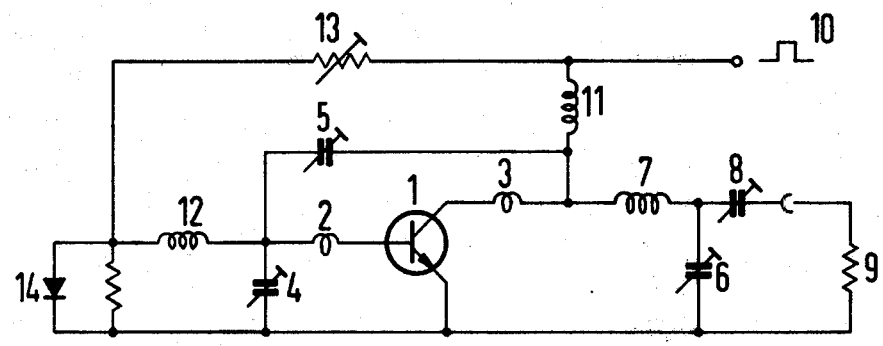
FIG. 1 is a schematic circuit diagram of an oscillatory circuit employed in the transmitter of a secondary radar, small interrogation device, whose frequency must be synchronized.

According to FIG. 1, an oscillator circuit employed in a secondary radar, small interrogation device, comprises a transistor 1 having a base connected to an inductance 2 and a collector connected to an inductance 3, essentially provided by means of transistor-internal wiring inductances. The inductance 2, along with a capacitor 4, provides tuning to resonance for the oscillator frequency which is to be transmitted. The very low-resistive input for the feedback which is coupled in by way of a capacitor 5 is thereby made more highly resistive. A capacitor 6, the inductance 3 and an additional inductance 7 are likewise tuned to the oscillator frequency which is to be transmitted, while the power is adapted to a load device 9 by way of a capacitor 8. Rectangular keying pulses 10 are fed to the collector of the transistor 1 by way of a choke 11, as well as to the base of the transistor 1 by way of a choke 12, in order to obtain an abrupt initiation of oscillation. The optimum base voltage is regulated with an adjustable resistor 13. With regard to the operating voltage, a diode 14 is connected in parallel with the base-emitter diode of the transistor 1 and effects a temperature stabilization of the operating point of the oscillator.

Figure 2:
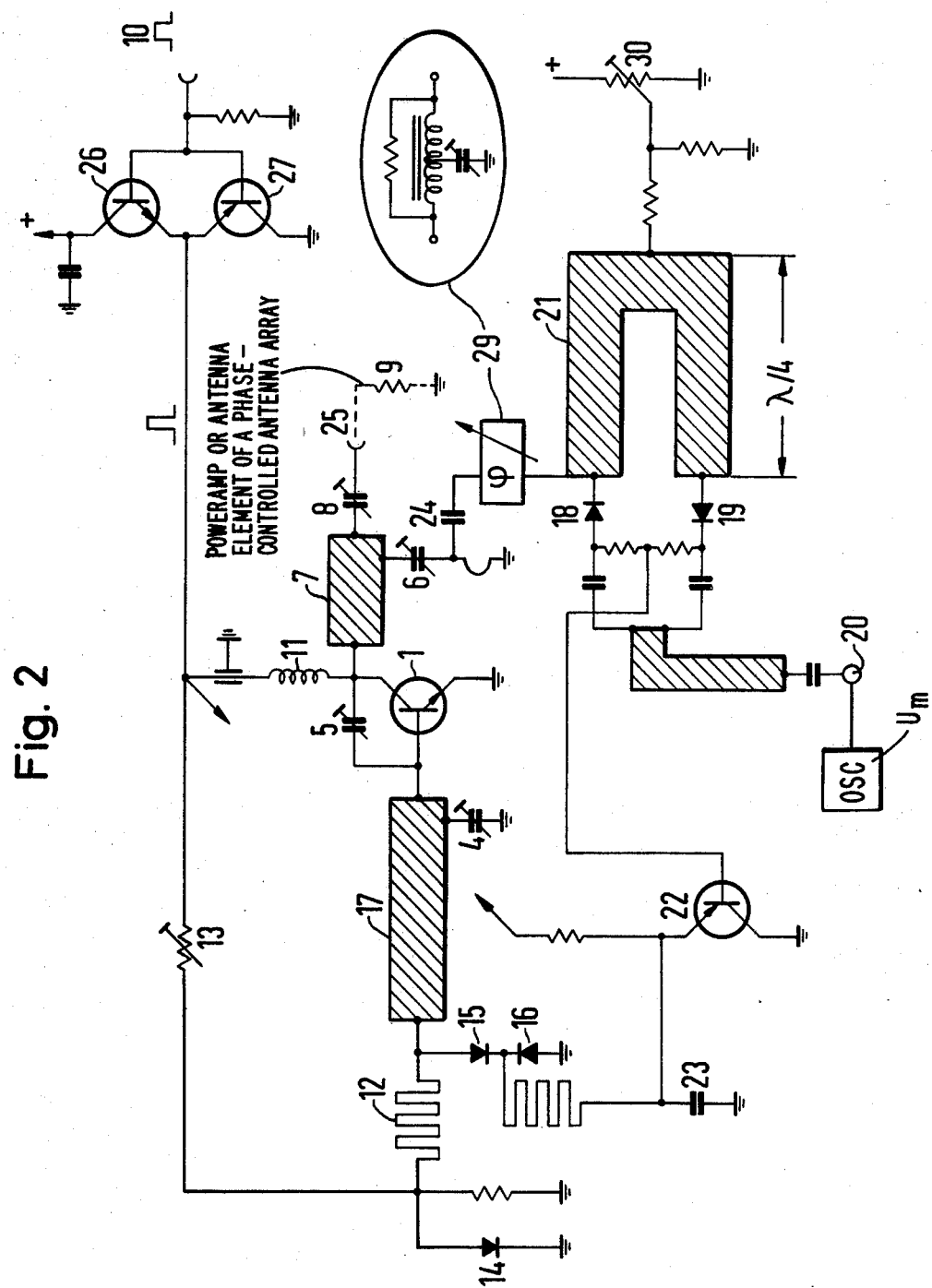
FIG. 2 illustrates an exemplary embodiment of an entire oscillation circuit constructed in accordance with the invention.

FIG. 2 illustrates the entire frequency control circuit for the purpose of synchronization, using strip lines. The same elements which coincide with those of the oscillator circuit of FIG. 1 bear corresponding reference characters in FIG. 2. The frequency control circuit comprises the coupling of two capacitance diodes 15 and 16 to the base oscillator circuit of the transistor 1 by way of a transforming conductance segment (length of strip line element) 17 and a phase discriminator having two diodes 18 and 19 which are operated in push-push relation with a comparison oscillation fed to an input 20, and which are operated in push-pull relation with the oscillation of the oscillator by way of a 2 × λ/4 line segment 21. A low pass filter is provided in the control loop and comprises the internal resistance of an amplifier transistor 22 and a capacitor 23.

The transistor 22 is connected as a emitter follower and is therefore an impedance converting transistor which is employed to impress the highly resistive regulating voltage to both of the varactor diodes 15 and 16, as well as to the capacitor 23 in a low-resistance state. The phase discriminator is connected, on the one hand, to the reference oscillation received at the input 20, and, on the other hand, the phase discriminator is connected to a small portion of the power output of the oscillator present at the output terminal 25, the small portion being tapped by way of a capacitor 6, an inductance and a capacitor 24 and fed thereto by way of an adjustable phase shifter 29. In order to be able to key the oscillator with the pulses 10 in a clean fashion, two transistors 26 and 27 are additionally provided which supply the keying current. In the exemplary embodiment, the phase shifter 29 comprises a longitudinal inductance which is bridged with a resistance, the inductance being provided with a center tap by way of which a trimmer capacitor is connected to ground.

Figure 3:
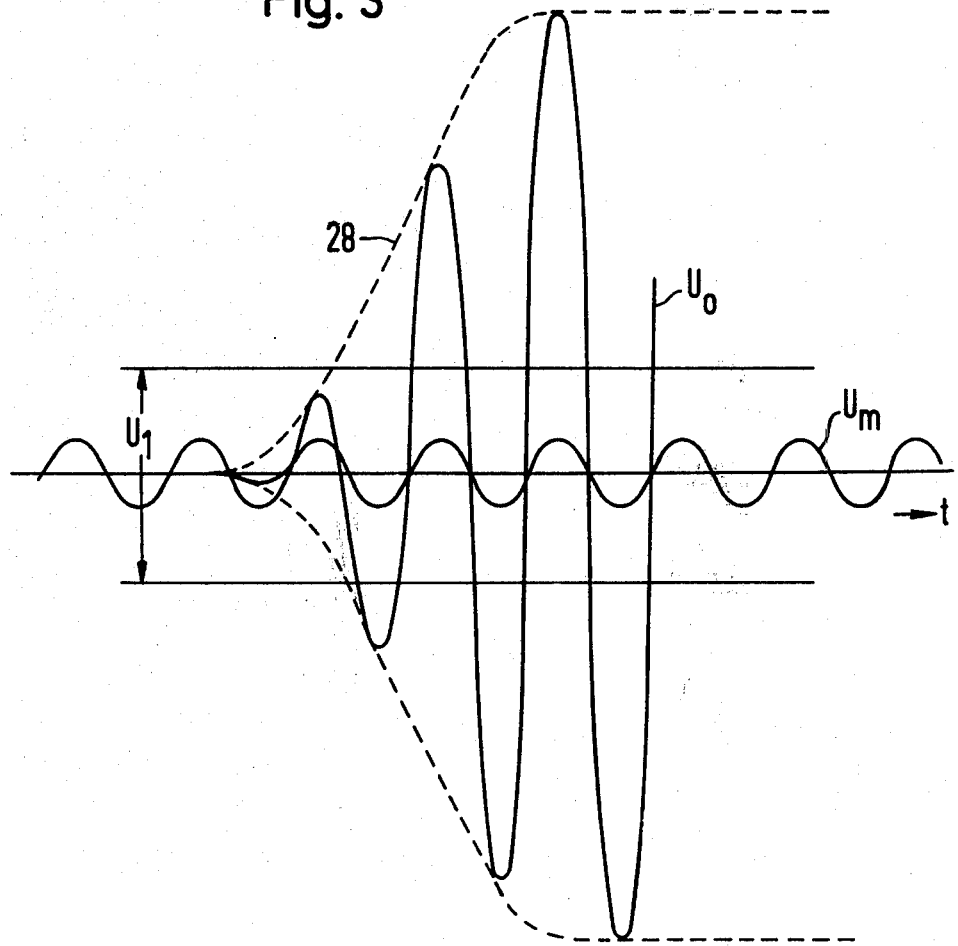
FIG. 3 is a graphic illustration of the initial oscillation process.

FIG. 3 illustrates, in a diagram dependent upon time t, how, by coupling the reference oscillation $U_m$—fed in at the input 20 in FIG. 2—, the pulling oscillation, at least during the initiation of oscillation, is sufficiently great in order that the oscillator begins to oscillate with the correct frequency. The pulling range is referenced $U_f$, and the frequency of the oscillator is designated with $U_o$. During the initiation of oscillation, a small regulating voltage immediately occurs, which voltage becomes greater with an increasing edge of the pulse 28, and which constantly maintains synchronism, so that the oscillation $U_o$ precisely follows the reference oscillation $U_m$ in frequency over the entire pulse.

An additional instance of application of the synchronization circuit according to the invention is to employ this circuit as an active element for phase-controlled antennas. Each antenna is fed with its own oscillator. As before, the comparison oscillation, adjusted in phase, can be supplied to the oscillator. It is useful here that only a small capacity is to be shifted in the phase, and that the damping is not disadvantageous. A second method resides in individually adjusting the operating point of each oscillator by way of a video line. Indeed, only one phase change of less than ±90° is possible vis-a-vis the comparison oscillation; on the other hand, this phase shift is possible directly from a computer, and thus it is particularly simple to provide. In practice, a combination of both possibilities should be optimal. The disadvantage of the oscillator method consists in that, due to the unavoidable detuning of the natural frequency of the oscillators, a phase error results which is proportional to the detuning and, inversely, proportional to the capture range. Thus, the constancy of frequency must be made as high as possible, and, the capture range must be made as large as possible. The latter is possible within wide boundaries through a video amplifier in the primary route. The advantage of these oscillator-antennas is that a high radiated capacity is possible with many small and inexpensive individual transmitters, in contrast with the conventional technology wherein the transmitting power is produced in an amplifier and is then distributed to the individual antennas by way of distributors and phase shifters having unavoidable losses.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A circuit for synchronizing an oscillation $U_o$ with a reference oscillation $U_m$ of comparatively small amplitude, comprising:
   a pulsed oscillator including an adjustable reactance for determining the frequency of oscillation;
   a pulse input for receiving oscillator activation pulses;
   an output for providing an output oscillation $U_o$;
   a reference input for receiving a reference oscillation $U_m$;
   an impedance converter;
   a phase shifter adjustable up to 180°; and
   a high resistance phase discriminator including said reference input and coupled to said output of said oscillator via said phase shifter, said phase discriminator connected to said adjustable reactance via said impedance converter to control and synchronize the output oscillation with the reference oscillation $U_m$.

2. The circuit of claim 1, wherein said phase discriminator includes means providing unsymmetrical tuning.

3. The circuit of claim 1, comprising crystal controlled reference oscillation means connected to said reference input.

4. The circuit of claim 1, wherein said adjustable reactance comprises at least one capacitance diode.

5. The circuit of claim 1, and further comprising a power amplifier connected to said output of said oscillator and driven thereby.

6. The circuit of claim 1, in combination with and connected to a respective antenna of a phase-controlled antenna array.

7. In a secondary radar interrogation and answering device, a circuit for synchronizing an oscillation $U_o$ with a reference oscillation of comparatively small amplitude, said circuit comprising:
   a pulsed oscillator including an adjustable reactance for determining the frequency of oscillation;
   a pulse input for receiving oscillator activation pulses;
   an output for providing an output oscillation $U_o$;
   a reference input for receiving a reference oscillation $U_m$;
   an impedance converter;
   a phase shifter adjustable up to 180°; and
   a high resistance phase discriminator including said reference input and coupled to said output of said oscillator via said phase shifter, said phase discriminator connected to said adjustable reactance via said impedance converter to control and synchronize the output oscillation with the reference oscillation $U_m$.

* * * * *